(12) United States Patent
Ikenaga et al.

(10) Patent No.: US 8,006,340 B2
(45) Date of Patent: Aug. 30, 2011

(54) CLEANING APPARATUS

(75) Inventors: Kazuyuki Ikenaga, Hachioji (JP);
Tsutomu Tetsuka, Kasumigaura (JP);
Muneo Furuse, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 165 days.

(21) Appl. No.: 12/285,177

(22) Filed: Sep. 30, 2008

(65) Prior Publication Data

US 2010/0050349 A1    Mar. 4, 2010

(30) Foreign Application Priority Data

Aug. 26, 2008   (JP) ................................. 2008-216343

(51) Int. Cl.
*A47L 13/40* (2006.01)
(52) U.S. Cl. ............................................. 15/1.51; 15/1
(58) Field of Classification Search ................. 15/1.51, 15/1
See application file for complete search history.

(56) References Cited

U.S. PATENT DOCUMENTS

| | | | | |
|---|---|---|---|---|
| 3,201,904 A * | 8/1965 | Evans et al. | .................... | 451/490 |
| 3,654,654 A * | 4/1972 | Abreu et al. | .................... | 15/1.51 |
| 4,313,284 A * | 2/1982 | Walsh | .......................... | 451/288 |
| 5,609,511 A * | 3/1997 | Moriyama et al. | ................ | 451/5 |
| 5,931,719 A * | 8/1999 | Nagahara et al. | ................ | 451/41 |
| 5,938,884 A * | 8/1999 | Hoshizaki et al. | ....... | 156/345.14 |
| 6,581,276 B2 * | 6/2003 | Chung | ............................ | 29/825 |
| 6,962,524 B2 * | 11/2005 | Butterfield et al. | ........... | 451/526 |
| 6,969,309 B2 * | 11/2005 | Carpenter | ..................... | 451/285 |
| 6,979,248 B2 * | 12/2005 | Hu et al. | ......................... | 451/28 |
| 6,988,942 B2 * | 1/2006 | Chen et al. | .................... | 451/533 |
| 6,991,526 B2 * | 1/2006 | Sun et al. | ....................... | 451/104 |
| 7,014,535 B2 * | 3/2006 | Custer et al. | .................... | 451/41 |
| 7,137,874 B1 * | 11/2006 | Bovio et al. | ..................... | 451/41 |
| 7,141,146 B2 * | 11/2006 | Bogart et al. | ................. | 204/199 |
| 7,207,878 B2 * | 4/2007 | Hu et al. | ........................ | 451/526 |
| 7,294,038 B2 * | 11/2007 | Manens et al. | .................... | 451/5 |
| 2003/0114087 A1 * | 6/2003 | Duboust et al. | ................. | 451/41 |
| 2004/0023610 A1 * | 2/2004 | Hu et al. | ........................ | 451/526 |

(Continued)

FOREIGN PATENT DOCUMENTS

JP        2000-021832        1/2000

(Continued)

*Primary Examiner* — Shay Karls
(74) *Attorney, Agent, or Firm* — Antonelli, Terry, Stout & Kraus, LLP.

(57) ABSTRACT

The invention provides a cleaning apparatus for removing particles attached to the fine roughness on the surface of an insulating body coated on the metal surface of a vacuum processing apparatus. The present cleaning apparatus comprises an adhesive sheet 5 having a base material 51 and an adhesive surface 52, a conductive sheet 7 in contact with the base material 51, and a pressing member 11 for pressing the conductive sheet 7 onto the adhesive sheet 5, a voltage applying mechanism 9 for applying positive or negative voltage to the conductive sheet 7, and a pressing force controlling mechanism 8 for pressing the adhesive sheet 5 onto the curved surface 10 of the vacuum processing apparatus, wherein the pressing member 11 presses the conductive sheet 7 and the adhesive sheet 5 by a pressing force controlled via the pressing force controlling mechanism 8 in order to closely adhere the adhesive surface 52 of the adhesive sheet 5 to the curved surface of the insulating body 10 so as to remove particles attached to the insulating body 10, and positive or negative voltage is applied to the conductive sheet 7 to generate electrostatic attraction force so as to attract and remove particles attached to the insulating body 10.

9 Claims, 15 Drawing Sheets

U.S. PATENT DOCUMENTS

| | | | |
|---|---|---|---|
| 2004/0053560 A1* | 3/2004 | Sun et al. | 451/36 |
| 2004/0082289 A1* | 4/2004 | Butterfield et al. | 451/526 |
| 2004/0192172 A1* | 9/2004 | Towery et al. | 451/41 |
| 2008/0108288 A1* | 5/2008 | Hu et al. | 451/548 |
| 2008/0176018 A1* | 7/2008 | Enniss et al. | 428/41.8 |
| 2008/0226878 A1* | 9/2008 | Benslimane et al. | 428/174 |
| 2009/0023833 A1* | 1/2009 | Taguchi et al. | 522/173 |

FOREIGN PATENT DOCUMENTS

| | | |
|---|---|---|
| JP | 2002-192084 | 7/2002 |
| JP | 2004-082038 | 3/2004 |
| JP | 2007-019443 | 1/2007 |
| JP | 2007-117838 | 5/2007 |
| JP | 2008-141049 | 6/2008 |

* cited by examiner

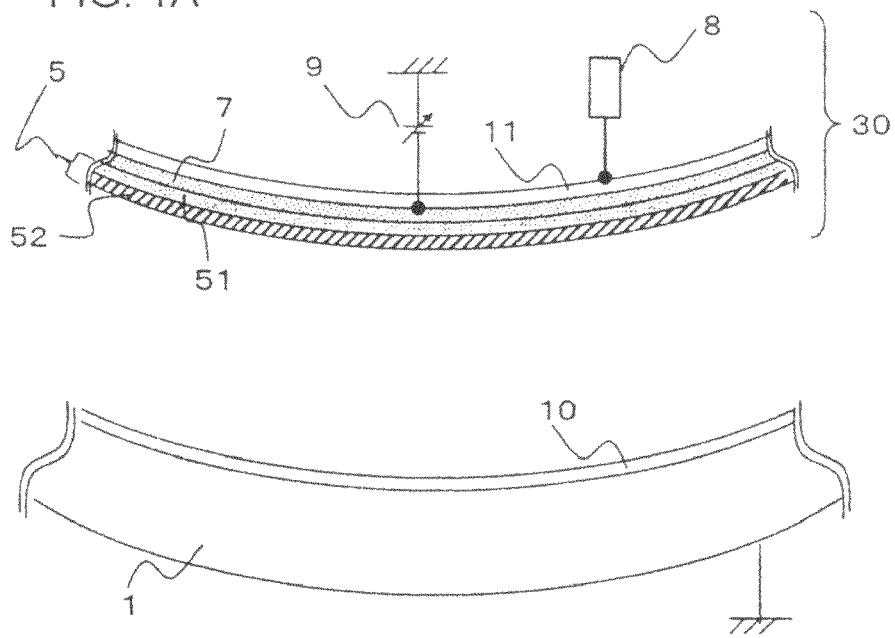
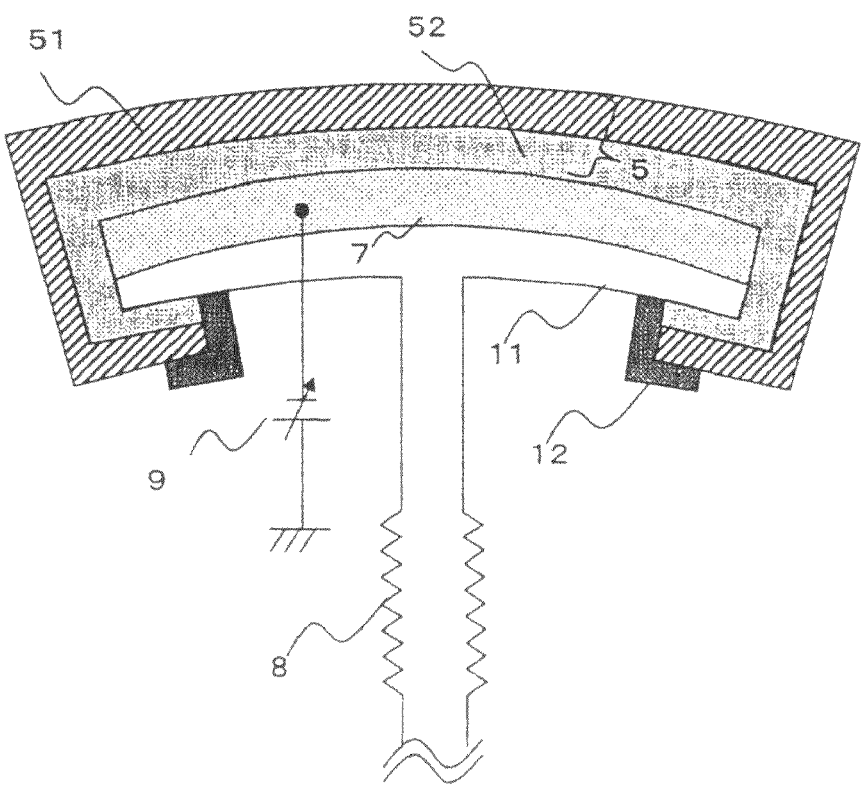

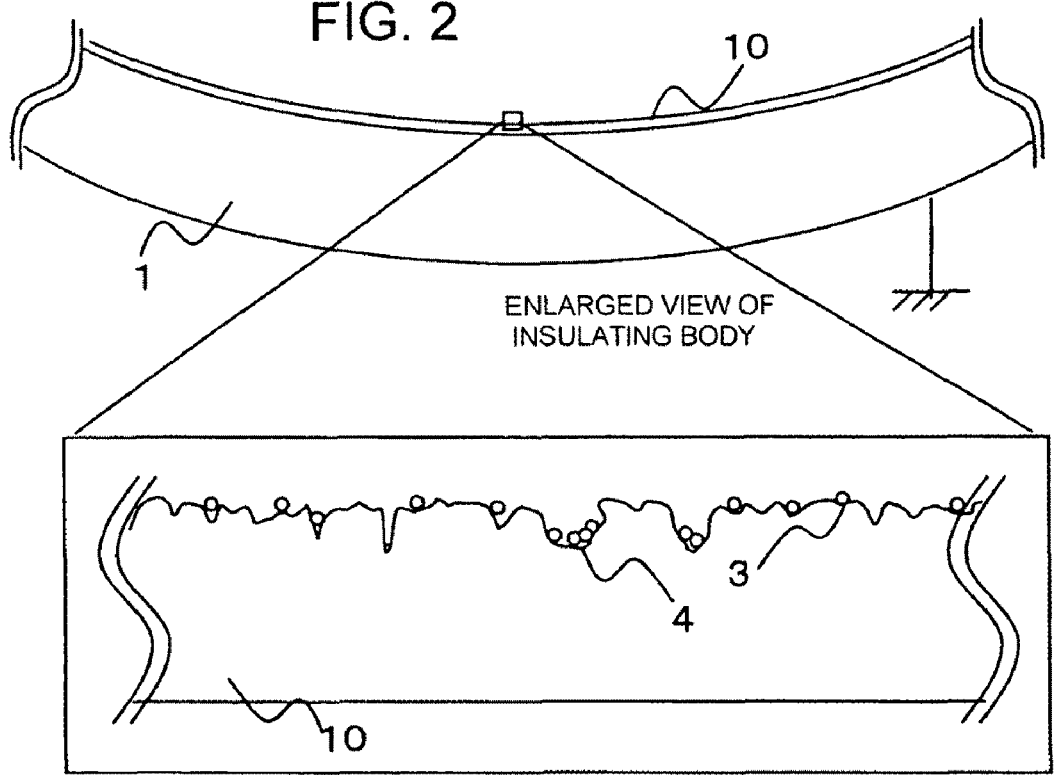

FIG. 3
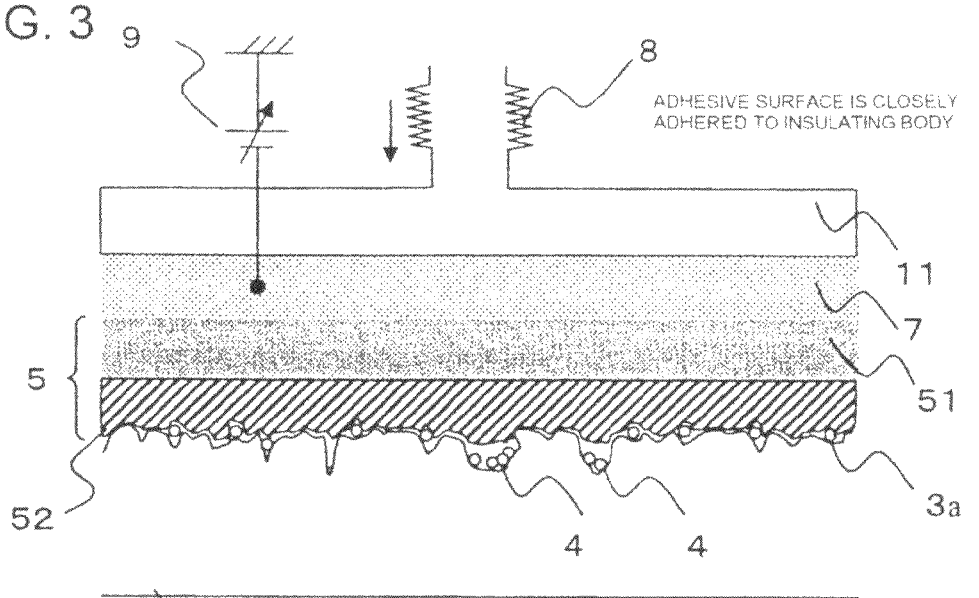
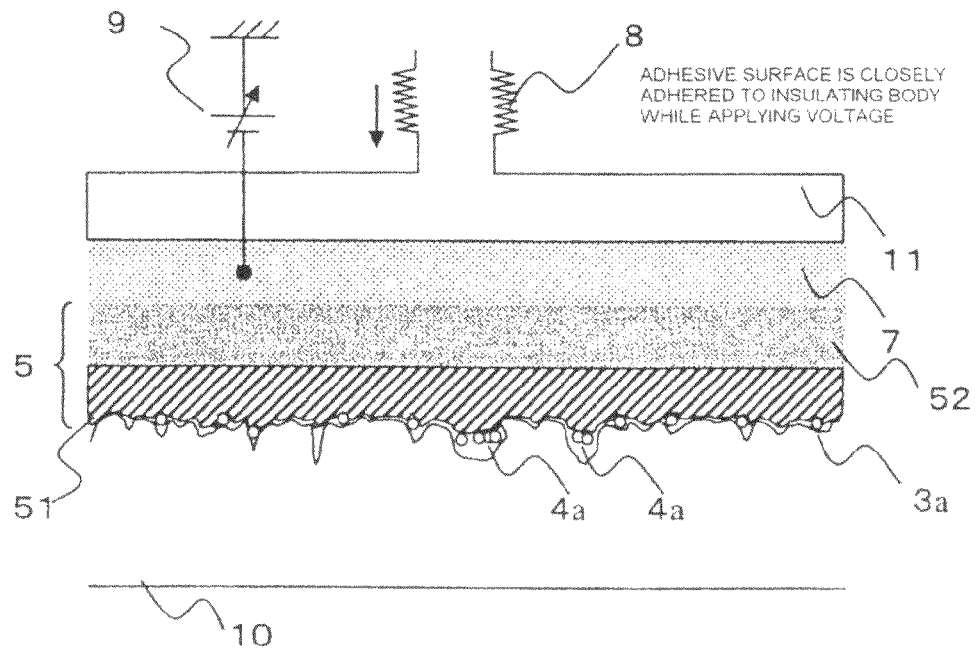

FIG. 8
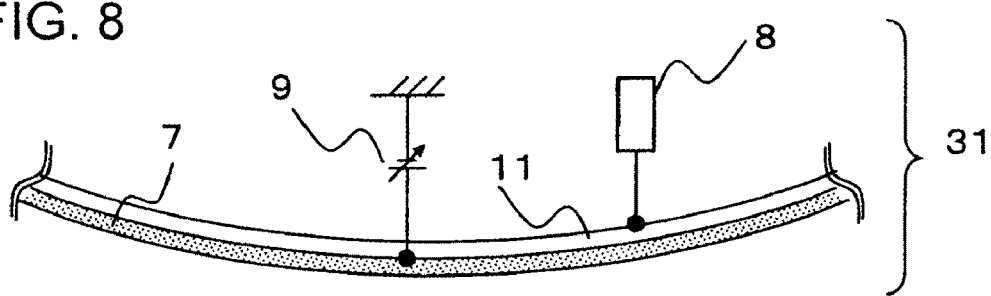
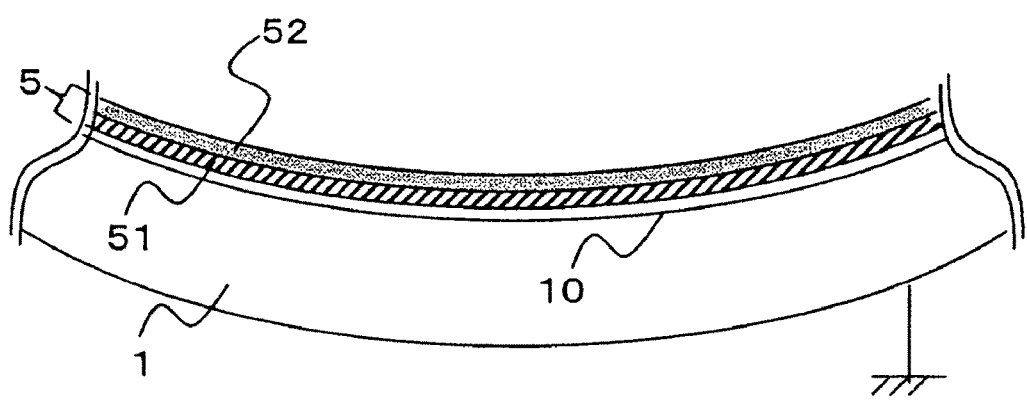

FIG. 9
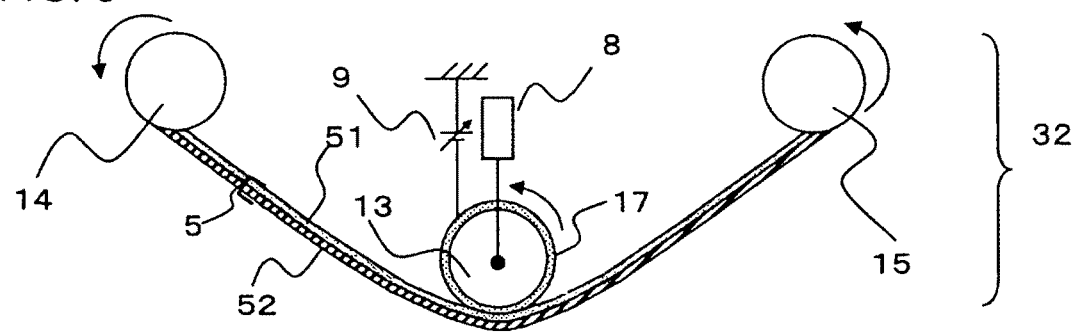
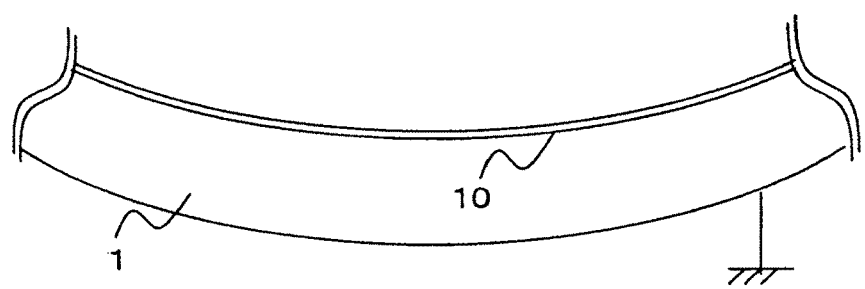

CLEANING APPARATUS

The present application is based on and claims priority of Japanese patent application No. 2008-216343 filed on Aug. 26, 2008, the entire contents of which are hereby incorporated by reference.

BACKGROUND OF THE INVENTION

1. Field of the Invention

The present invention relates to a cleaning apparatus and cleaning method for cleaning vacuum processing apparatuses used for manufacturing semiconductor devices, flat panel display boards and other products, and for cleaning test devices having vacuum processing apparatuses used for testing semiconductor devices, flat panel display boards and other products.

2. Description of the Related Art

Recently, vacuum processing apparatuses using plasma are widely used in the process of manufacturing semiconductor devices and flat panel displays. In plasma vacuum processing apparatuses, reactive gases or deposition material gases fed into a vacuum reactor are discharged via microwaves and high frequencies so as to process a sample to be processed placed on the stage. Components of the plasma vacuum processing apparatuses include metal components, components made of insulating material, and metal components having surfaces coated with insulating material.

Methods for removing particles attached to components include wiping the components by hand using fabric dampened with organic solvent, cleaning performed via ultrasonic waves, cleaning performed via cleaning sheets, cleaning performed by injecting dry ice ($CO_2$), cleaning performed by injecting high-pressure water, and cleaning performed by injecting a mixture of gas and fluid.

Japanese patent application laid-open publication No. 2004-82038 (patent document 1) discloses a method for cleaning an object to be cleaned by injecting a cleaning medium through an ultrasonic cleaning nozzle. Further, Japanese patent application laid-open publication No. 2007-19443 (patent document 2) discloses a prior art cleaning method of placing a wafer having a conductive resin coating on a stage, applying voltage to the stage so as to hold the wafer on the stage, and removing particles on the stage.

However, if the cleaning method disclosed in patent document 1 is used to clean the insulating body coated on the surface of the metal component, the particles attached to the fine surface roughness on the surface of the insulating body coated on the surface of the metal component may not be removed since ultrasonic waves do not reach the depth of the fine surface roughness on the surface of the insulating body.

Further prior art cleaning methods include cleaning performed by injecting powdered dry ice to an object to be cleaned (refer for example to Japanese patent application laid-open publication No. 2007-117838), cleaning performed by immersing the object to be cleaned in a cleaning fluid and spraying high-pressure fluid through a nozzle to the object to be cleaned in an atomized state (refer for example to Japanese patent application laid-open No. 2000-21832), and cleaning performed by injecting a cleaning fluid formed by mixing gas and fluid onto the object to be cleaned (refer for example to Japanese patent application laid-open publication No. 2008-141049).

When applying the above-mentioned method for cleaning an object by injecting powdered dry ice, atomized fluid or cleaning fluid formed by mixing gas and fluid to clean an insulating body coated on the surface of a metal component, the particles attached to the fine surface roughness on the surface of the insulating body coated on the surface of the metal component may not be removed since the injected cleaning fluid or the like do not reach the depth of the fine surface roughness on the surface of the insulating body coated on the surface of the metal component.

Another prior art cleaning method proposes adhering a cleaning sheet on a wafer, and carrying the wafer having the cleaning sheet attached to the surface thereof onto a stage for placing the sample to be processed so as to clean the transfer arm and the upper surface of the stage (refer for example to Japanese patent application laid-open publication No. 2002-192084). However, this cleaning method can only be applied to cleaning flat components such as the transfer arm for transferring the sample or the stage on which the sample is placed, and cannot remove particles attached to the fine roughness on the surface of the insulating body coated on a metal component or on a curved surface of components constituting the plasma vacuum processing apparatus.

If plasma processing is started using components not having been cleaned sufficiently, the particles attached to the curved surface of the vacuum processing chamber or to the fine roughness on the surface of the insulating body coated on the surface of metal components may attach to the surface of the sample to be processed, causing defective semiconductor devices. Further, the particles attached to the surface of the sample to be processed increase the amount of contamination. Moreover, such fine particles increase in number as the particle diameter minimizes, and the very fine particles attached to the fine roughness on the surface of the insulating body coated on the surface of the metal components of the vacuum processing chamber become even more difficult to remove via cleaning using fluid. Further, since the coating on the surface of the insulating body is formed for example by thermally spraying insulating material, fine roughness is formed on the surface thereof, and the roughness may collapse if excessive pressure is applied thereto, leading to causing more particles.

SUMMARY OF THE INVENTION

The present invention aims at solving the problems of the prior art mentioned above by providing a cleaning apparatus and cleaning method capable of removing particles attached to the curved surface of the vacuum processing apparatus and particles attached to the fine roughness on the surface of the insulating body coated on the surface of metal components.

According to the first aspect of the present invention, the cleaning apparatus comprises an exchangeable adhesive sheet, a conductive sheet having flexibility disposed on the opposite side from an adhesive surface of the adhesive sheet, and a pressing member having a voltage applying mechanism for applying positive or negative voltage to the conductive sheet and a pressing force controlling mechanism for pressing the adhesive sheet onto a curved surface of a portion to be cleaned of a vacuum processing apparatus from above the conductive sheet, wherein the pressing member has a shape similar to the shape of the portion to be cleaned, and the pressing member presses the conductive sheet and the adhesive sheet by the pressing force controlled via the pressing force controlling mechanism so as to closely adhere the adhesive surface of the adhesive sheet to the curved surface of the portion to be cleaned of the vacuum processing apparatus, while applying positive or negative voltage to the conductive sheet by the voltage applying mechanism.

According to the second aspect of the present invention, the cleaning apparatus comprises a conductive sheet having flexibility, a voltage applying mechanism for applying positive or negative voltage to the conductive sheet, and a pressing member having a pressing force controlling mechanism for pressing an adhesive sheet adhered to a curved surface of a vacuum processing apparatus from above the conductive sheet, wherein the pressing member has a shape similar to the shape of the portion to be cleaned, and the pressing member presses the conductive sheet and the adhesive sheet adhered to the curved surface of the portion to be cleaned of the vacuum processing apparatus by a pressing force controlled via the pressing force controlling mechanism, so as to closely adhere the adhesive surface of the adhesive sheet to the curved surface of the portion to be cleaned of the vacuum processing apparatus, while applying positive or negative voltage to the conductive sheet by the voltage applying mechanism.

According to the third aspect of the present invention, the adhesive sheet is formed into a roll so that a new adhesive surface of the adhesive sheet is constantly supplied, and the cleaning apparatus further comprises a mechanism for recovering the adhesive sheet into a roll so that the already-used adhesive surface is not used again, and an elastic structure having a pressing force controlling mechanism for controlling the pressing force, wherein at least the surface of the structure has conductivity, and the structure is pressed onto the adhesive sheet from the opposite side from the adhesive surface by a pressing force controlled via the pressing force controlling mechanism, so as to closely adhere the adhesive surface of the adhesive sheet positioned below the structure to the curved surface of the portion to be cleaned of the vacuum processing apparatus, and through rotation of the structure, the cleaning apparatus is moved while applying positive or negative voltage to the conductive portion of the structure by the voltage applying mechanism.

According to the fourth aspect of the present invention, the cleaning apparatus comprises an elastic structure having a pressing force controlling mechanism for controlling the pressing force, wherein at least the surface of the structure has conductivity, and the structure is pressed onto an adhesive sheet adhered to a curved surface of the portion to be cleaned of the vacuum processing apparatus by a pressing force controlled via the pressing force controlling mechanism, so as to closely adhere the adhesive surface of the adhesive sheet positioned below the structure to the curved surface of the portion to be cleaned of the vacuum processing apparatus, and through rotation of the structure, the cleaning apparatus is moved while applying positive or negative voltage to the conductive portion of the structure by the voltage applying mechanism.

BRIEF DESCRIPTION OF THE DRAWINGS

FIGS. 1A and 1B are schematic views illustrating the arrangement of a cleaning apparatus according to a first embodiment of the present invention;

FIG. 2 is a cross-sectional view showing in enlarged view the surface of an insulating body coated on a metal surface according to the present invention;

FIG. 3 is a conceptual diagram illustrating the status of removing particles by the cleaning apparatus according to the first and fourth embodiments of the present invention;

FIG. 8 is a schematic view explaining the arrangement of a cleaning apparatus according to a second embodiment of the present invention;

FIG. 9 is a schematic view illustrating the arrangement of a cleaning apparatus according to a third embodiment of the present invention;

DETAILED DESCRIPTION OF THE PREFERRED EMBODIMENTS

Figure 4:
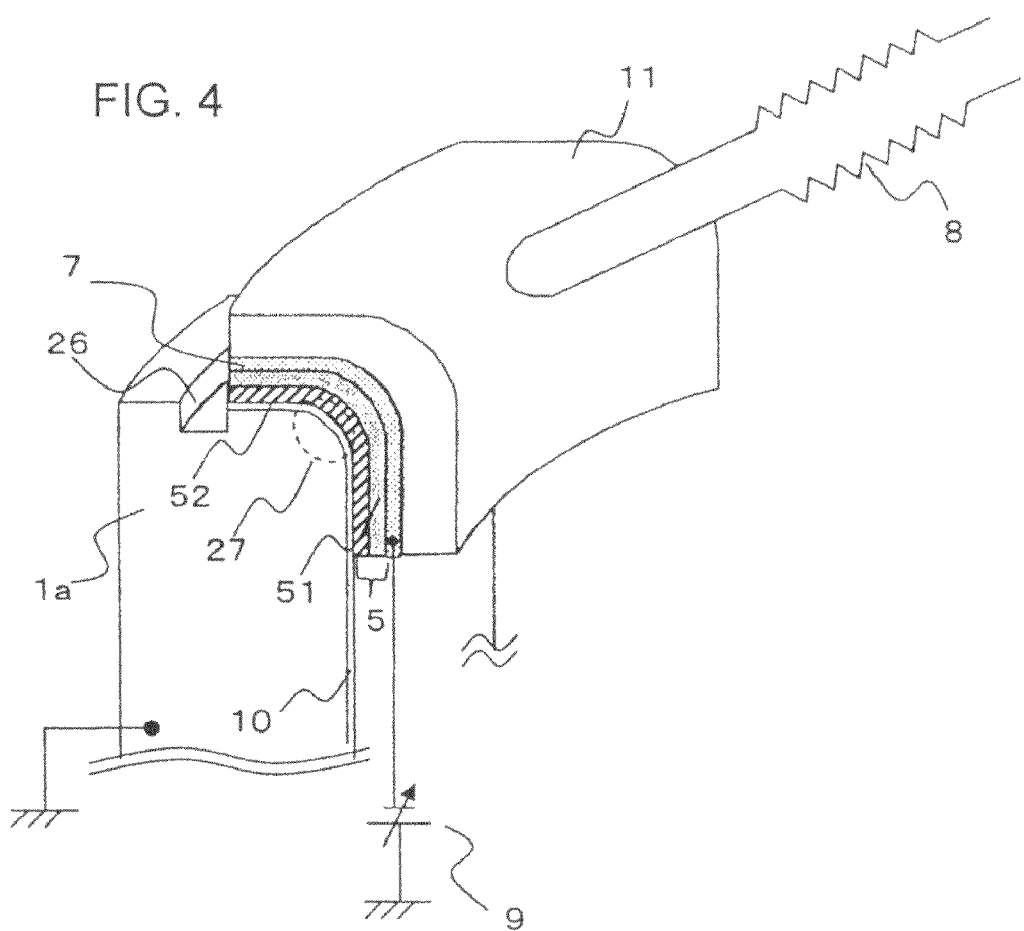
FIG. 4 is a view illustrating the cleaning method of the portion having a curved surface shape according to the first embodiment of the present invention.

Now, the preferred embodiments of the present invention will be described with reference to FIGS. 1 through 17. The present invention is not restricted to the field of manufacturing and testing semiconductor devices, and is applicable to various other fields such as manufacturing of flat displays and various plasma surface treatments. The following embodiments are illustrated taking as an example a plasma etching apparatus for manufacturing semiconductor devices. FIG. 17 is a view showing a portion of the side view of a plasma vacuum processing apparatus to which the present invention is applied.

In the plasma vacuum processing apparatus, a processing chamber 25 in which plasma is generated for processing has a side wall 1, a top panel 19 and a bottom panel 23. The bottom panel 23 has an evacuation port 231 for evacuating the processing chamber 25. A wafer 24, which is the sample to be processed, is supported by electrostatic force of an electrostatic chuck 18 at a lower portion of the processing chamber 25, and a high frequency power supply 22 for supplying high frequency to the wafer 24 during plasma processing is connected thereto. A top panel 19 formed of dielectric is disposed on the upper portion of the processing chamber 25 for introducing plasma-generating high frequency. An upper electrode 20 is disposed on top of the top panel 19, to which is connected a high frequency power supply 21 for applying high frequency to the upper electrode 20. The side wall 1 of the processing chamber 25 includes a curved surface formed of aluminum or other metal material. In addition, an insulating body 10 formed of an oxide of alumina, yttrium or the like is coated for example via thermal spraying to a thickness of approximately 50 μm to a few hundred μm on the aluminum surface on the inner side of the side wall 1. The side wall 1 of the processing chamber 25 is grounded.

Embodiment 1

FIGS. 1 through 7 are referred to in describing a cleaning apparatus and a cleaning method according to a first embodiment of the present invention. The present invention utilizes the processing chamber 25 of the plasma vacuum processing apparatus illustrated in FIG. 17 in an atmospheric state.

FIGS. 1A and 1B are referred to in illustrating the structure of a cleaning apparatus 30 according to a first embodiment of the present invention, taking as an example the cleaning of an insulating body 10 coated on the surface of a side wall 1 of the processing chamber 25.

The cleaning apparatus 30 is composed of an adhesive sheet 5 including a base material 51 and an adhesive surface 52, and a conductive sheet 7 having flexibility attached to the side of the adhesive sheet 5 opposite from the adhesive surface 52. The adhesive surface 52 is formed of an adhesive material that does not have any negative effect on the wafer such as contamination, even if substances such as carbon-based fluorine resin constituting the adhesive surface reside on the surface of the insulating body 10. The conductive sheet 7 is formed of a conductive substance having flexibility, such as carbon-containing resin. As for conductive substances other than that described above for constituting the conductive sheet 7, a conductive thin film such as aluminum having flexibility can be adhered to or coated on the surface of the base material 51 or a pressing panel 11. The base material 51 is formed of a material having insulating performance, or a material having conductivity, chosen depending on the circumstances. For example, when the insulating body 10 coated on the surface of the component to be cleaned is as thin as approximately a few μm, insulation breakdown may occur to insulating body 10 when voltage is applied if the base material 51 is formed of a conductive material. In order to prevent such problem from occurring, the base material 51 should be formed of a material having insulating performance. On the other hand, if the insulating body 10 is as thick as a few tens of μm, insulation breakdown of the insulating body 10 will not occur even when voltage is applied. In such case, the base material 51 may be formed of insulating material, but in order to enhance the electrostatic chucking force occurring on the adhesive surface 52, the base material 51 should preferably be formed of material having conductivity. As shown in FIG. 1B, the adhesive sheet 5 is fixed to the cleaning apparatus 30 via an attachment 12, and the adhesive sheet 5 can be exchanged easily by removing the attachment 12.

The surface of the insulating body 10 having been coated on the surface of the side wall 1 of the processing chamber 25 has a roughness in the order of a few μm to a few tens of μm, so that the thickness of the adhesive surface 52 should be between 5 μm to 50 μm.

In order to adhere the adhesive surface 52 of the adhesive sheet 5 arranged below the conductive sheet 7 to the insulating body 10 coated on the surface of the side wall 1 of the processing chamber 25, an elastic pressing panel 11 formed for example of sponge or rubber having a pressing force adjusting mechanism 8 is arranged on the upper portion of the conductive sheet 7.

In order to closely adhere the adhesive surface 52 to the insulating body 10 coated on the surface of the side wall 1 of the processing chamber 25, the pressing panel 11 should preferably have substantially the same curvature as the curvature of the inner side of the side wall 1 of the processing chamber 25 to be cleaned. In other words, the radius of the pressing panel 11 should preferably be determined by subtracting a value substantially equivalent to the thickness of the adhesive sheet from the radius of the inner surface of the side wall 1 of the processing chamber 25 to be cleaned, so that the shape of the pressing panel should be equal or similar to the shape of the portion to be cleaned.

A voltage applying mechanism 9 for applying positive or negative DC voltage is connected to the conductive sheet 7. One end of the voltage applying mechanism 9 is grounded. The voltage applying mechanism 9 can apply either positive or negative DC voltage to the conductive sheet 7, or can apply voltage having temporally changed polarities. Further, the voltage should preferably be controlled to an arbitrary voltage suitable for attracting particles.

Next, a method for cleaning the insulating body 10 coated on the surface of the side wall 1 of the processing chamber 25 using the cleaning apparatus 30 according to the first embodiment of the invention will be described.

By bringing the adhesive surface 52 of the adhesive sheet 5 in contact with the insulating body 10 coated on the surface of the side wall 1 and pressing the pressing panel 11 from above the conductive sheet 7 onto the adhesive sheet 5 by a pressing force controlled via the pressing force controlling mechanism 8 disposed on the upper portion of the conductive sheet 7, the adhesive surface 52 of the adhesive sheet 5 can be closely adhered to the surface of the insulating body 10 coated on the surface of the side wall 1 of the processing chamber 25. In this state, positive or negative DC voltage is applied from the voltage applying mechanism 9 to the conductive sheet 7, according to which the insulating body 10 coated on the surface of the side wall 1 of the processing chamber 25 can be cleaned. The positive or negative voltage applied on the conductive sheet 7 can be changed temporally.

The concept of removing particles attached to the surface of the insulating body 10 coated on the surface of the side wall 1 of the processing chamber 25 using the cleaning apparatus 30 according to the first embodiment of the present invention is described with reference to FIGS. 2 and 3.

FIG. 2 illustrates a view enlarging the surface of the insulating body 10 coated on the surface of the side wall 1 of the processing chamber 25. The surface of the insulating body 10 coated on the surface of the side wall 1 of the processing chamber 25 has a roughness of a few μm to a few tens of μm, and particles 3 and 4 are attached to the convexed and concaved portions of the insulating body 10 coated on the surface of the side wall 1 of the processing chamber 25.

FIG. 3 illustrates a state in which the pressing panel 11 is pressed onto the adhesive sheet 5 from above the conductive sheet 7 by a pressing force controlled via the pressing force controlling mechanism 8 disposed above the conductive sheet 7, so as to closely adhere the adhesive surface 52 of the adhesive sheet 5 to the surface of the insulating body 10 coated on the surface of the side wall 1 of the processing chamber 25, and wherein a DC voltage is applied from the voltage applying mechanism 9 to the conductive sheet 7.

In the upper drawing of FIG. 3, the adhesive surface 52 is closely adhered to the surface of the insulating body 10 coated on the surface of the side wall 1 of the processing chamber 25, according to which the particle 3 attached to a convexed portion of the insulating body 10 coated on the surface of the side wall 1 of the processing chamber 25 is adhered to the adhesive surface 52 (particle 3*a*). At this time, the pressing force controlled via the pressing force controlling mechanism 8 should preferably be smaller than the intensity (hardness) of the insulating body 1 coated on the surface of the side wall 1 of the processing chamber 25, so as to prevent breaking of the insulating body 10.

In the lower drawing of FIG. 3, while the adhesive surface 52 is closely adhered to the surface of the insulating body 10 coated on the surface of the side wall 1 of the processing chamber 25, the voltage applying mechanism 9 applies DC voltage to the conductive sheet 7. Thereby, electrostatic attraction force occurs to the adhesive surface 52, and by the electrostatic attraction force, the particles 4 attached to the concaved portions of a few μm to a few tens of μm on the insulating body 10 coated on the surface of the side wall 1 of the processing chamber 25 is attracted to the adhesive surface 52 and attached thereto (particles 4*a*). In general, particles are positively or negatively charged depending on its component or character, however, by changing the polarity of the DC voltage applied via the voltage applying mechanism 9, all the particles can be removed. The positive or negative voltage applied via the voltage applying mechanism can be varied temporally.

Once the particles are attached to the adhesive surface 52, the particles 3*a* and 4*a* removed from the convexed and concaved portions of the insulating body 10 coated on the surface of the side wall 1 of the processing chamber 25 and attached to the adhesive surface 52 will not fall from the adhesive surface 52 even if the voltage of the voltage applying mechanism 9 is turned off, so the particles can be removed from the surface of the insulating body 10 coated on the surface of the side wall 1 of the processing chamber 25.

Next, the method for cleaning an insulating body 10 coated on an end portion of the side wall 1 of the processing chamber 25 by the cleaning apparatus 30 according to the first embodiment of the present invention will be described with reference to FIGS. 4 and 5.

An end portion 1*a* of the side wall 1 of the processing chamber 25 illustrated in FIG. 4 is the portion coming into contact with the top panel 19 via an o-ring disposed in an o-ring groove 26. In general, in the process of coating an insulating body 10 on the surface of a metal component, if the portion being coated is angular, the coating on the angular portion becomes uneven or the coating may be cracked, therefore, the angular portion is processed into a curved shape 27. The cleaning of the insulating body 10 coated on the surface of a curved surface shape 27 on the end portion 1*a* of the side wall 1 of the processing chamber 25 using the cleaning apparatus 30 according to the first embodiment of the present invention is performed by forming the shape of the pressing panel 11 to be equal or similar to the curved surface shape 27 of the end portion 1*a* of the side wall 1 of the processing chamber 25, pressing the adhesive sheet 5 from above the conductive sheet 7 by the pressing panel 11 via a pressing force controlled via a pressing force controlling mechanism 8 disposed above the conductive sheet 7 so as to closely adhere the adhesive surface 52 of the adhesive sheet 5 to the insulating body 10 coated on the surface of the curved surface shape 27 on the end portion 1*a* of the side wall 1 of the processing chamber 25, and applying positive or negative DC voltage to the conductive sheet 7 via the voltage applying mechanism 9. The positive or negative voltage applied via the voltage applying mechanism 9 can be varied temporally.

Figure 5:
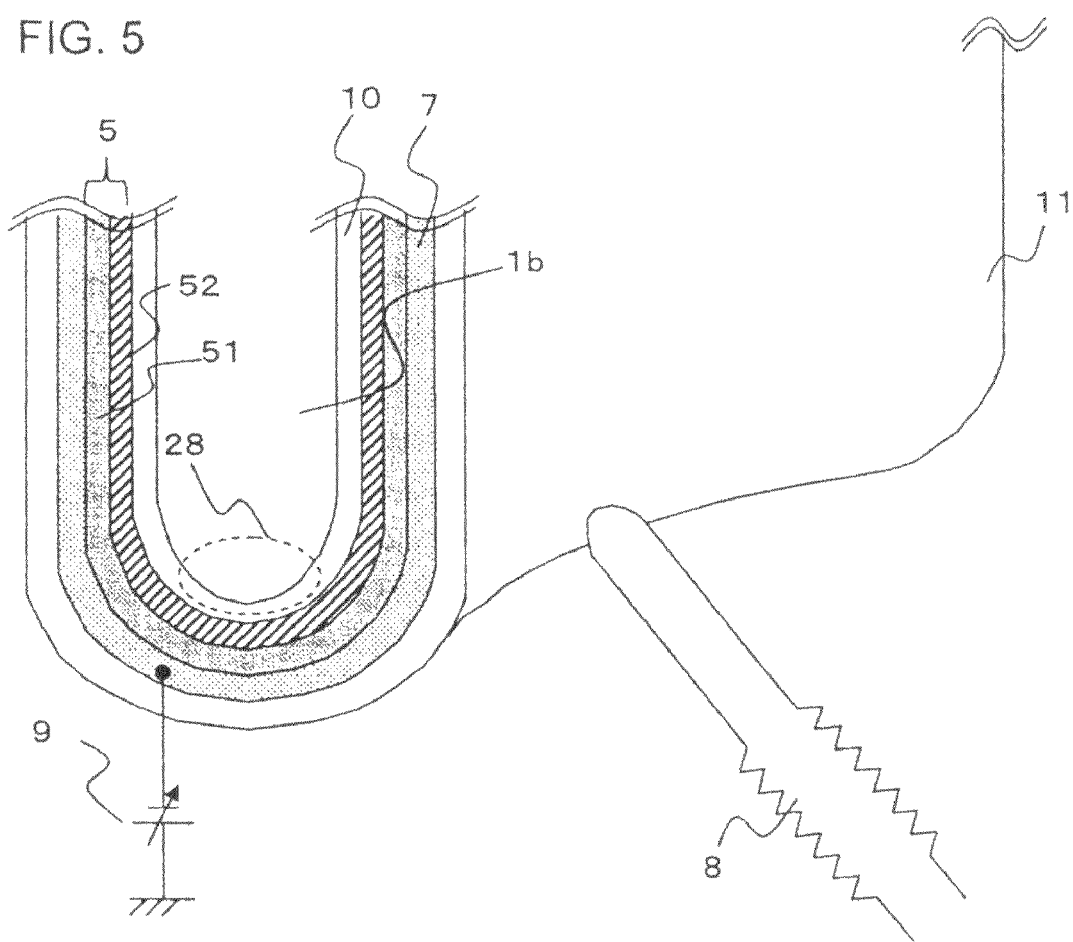
FIG. 5 is a view illustrating the cleaning method of the portion having a curved surface shape according to the first embodiment of the present invention.

FIG. 5 illustrates an opposite end 1*b* from the end 1*a* of the side wall 1 of the processing chamber 25, for example. By reasons described with reference to FIG. 4, the end portion 1*b* of the side wall 1 of the processing chamber 25 is processed into a curved surface shape 28 instead of an angular shape. The cleaning of the insulating body 10 coated on the surface of a curved surface shape 28 on the end portion 1*b* of the side wall 1 of the processing chamber 25 using the cleaning apparatus 30 according to the first embodiment of the present invention is performed by forming the shape of the pressing panel 11 to be equal or similar to the curved surface shape 28 of the end portion 1*b* of the side wall 1 of the processing chamber 25, pressing the adhesive sheet 5 from above the conductive sheet 7 by the pressing panel 11 by a pressing force controlled via a pressing force controlling mechanism 8 disposed above the conductive sheet 7 so as to closely adhere the adhesive surface 52 of the adhesive sheet 5 to the insulating body 10 coated on the surface of the curved surface shape 28 on the end portion 1*b* of the side wall 1 of the processing chamber 25, and applying positive or negative DC voltage to the conductive sheet 7 via the voltage applying mechanism 9. The positive or negative voltage applied via the voltage applying mechanism 9 can be varied temporally.

The method for cleaning the whole surface of the insulating body 10 coated on the surface of the side wall 1 of the processing chamber 25 by the cleaning apparatus 30 according to the first embodiment of the present invention will be described with reference to FIGS. 6 and 7.

Figure 6A:
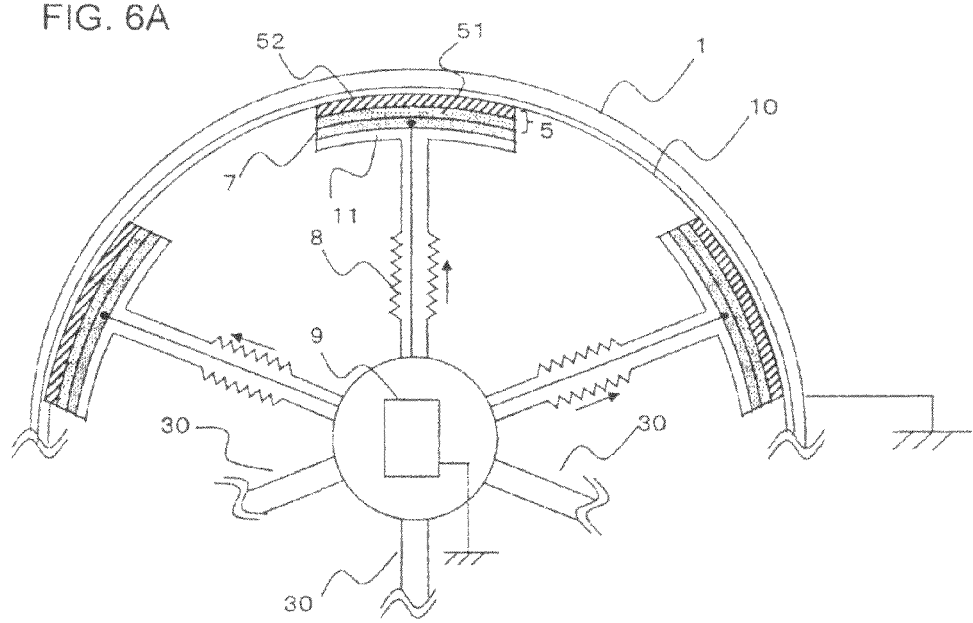
FIGS. 6A and 6B are views illustrating the method for cleaning the whole surface of a side wall of the processing chamber according to the first embodiment of the present invention.
Figure 6B:
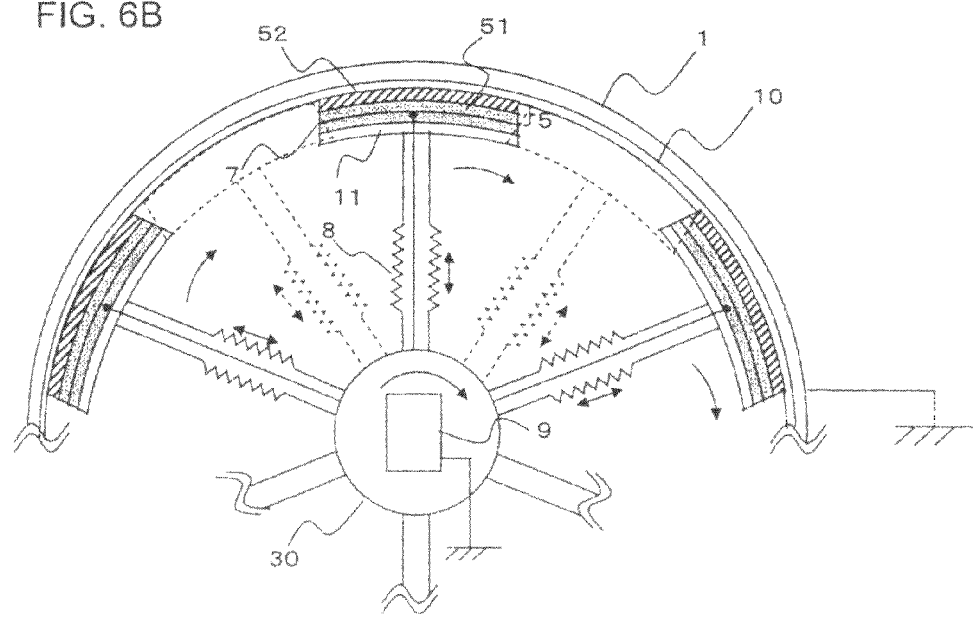

According to the first method, as illustrated in FIG. 6A, a plurality of cleaning apparatuses 30 are arranged in combination to clean the corresponding portions, and thereafter, as illustrated in FIG. 6B, the plurality of assembled cleaning apparatuses 30 are pivotally moved to the portions illustrated by the dashed lines so as to enable cleaning of the whole surface of the insulating body 10 coated on the surface of the side wall 1 of the processing chamber 25. When pivoting the cleaning apparatus 30, the pressing force controlled by the pressing force controlling mechanism 8 is released, and after pivoting the apparatus to the new portion to be cleaned, the adhesive surface 52 is closely adhered to the surface of the insulating body 10 coated on the surface of the side wall 1 of the processing chamber 25 by the pressing force controlled via the pressing force controlling mechanism 8. Preferably, the adhesive sheet 5 having been closely adhered to the side wall 1 of the processing chamber 25 is replaced with a new adhesive sheet. Thereby, it becomes possible to prevent recontamination by the particles attached to the adhesive surface 52 being reattached to the portion to be newly cleaned of the insulating body 10 coated on the surface of the side wall 1 of the processing chamber 25 when the apparatus is moved to a new cleaning portion.

Figure 7:
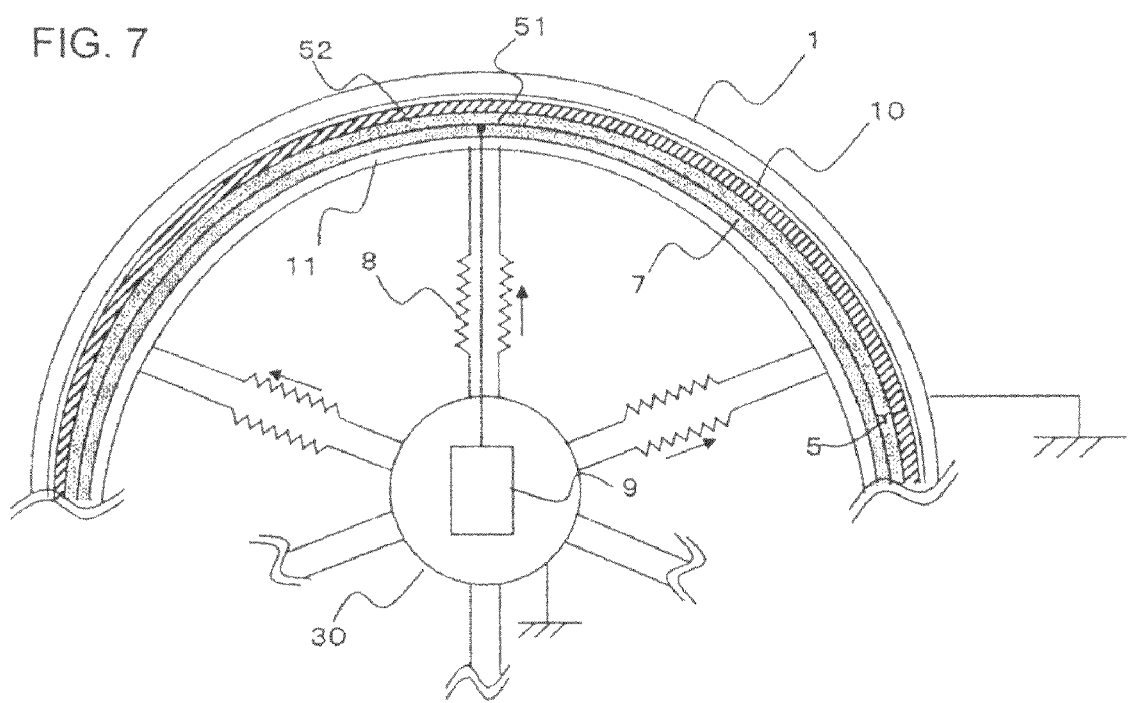
FIG. 7 is a view illustrating another method for cleaning the whole surface of the side wall of the processing chamber according to the first embodiment of the present invention.

According to a second method, as shown in FIG. 7, the adhesive sheet 5 constituting the cleaning apparatus 30, the conductive sheet 7 arranged on the opposite side of the adhesive surface 52 and the pressing panel 11 having the pressing force controlling mechanism 8 arranged on the upper portion of the conductive sheet 7 are formed to a same size (height and curvature) as that of the side wall 1 of the processing chamber 25, so that the whole surface of the insulating body 10 coated on the surface of the side wall 1 of the processing chamber 25 can be cleaned.

According to the first and second method for cleaning the whole surface of the insulating body 10 coated on the surface of the side wall 1 of the processing chamber 25, large-sized particles on the insulating body 10 coated on the surface of the side wall 1 of the processing chamber 25 are first removed, so it is preferable to perform a plurality of cleaning processes for the same portion in order to improve the effect of the cleaning. Further, the adhesive sheet 5 should preferably be exchanged each time the cleaning is performed. Thereby, it becomes possible to prevent re-contamination in which the particles attached to the adhesive surface 52 are re-attached to the new portion to be cleaned on the insulating body 10 coated on the surface of the side wall 1 of the processing chamber 25.

The method for cleaning the whole surface of the insulating body 10 being coated on the end portions of the side surface 1 of the processing chamber 25 illustrated in FIGS. 4 and 5 according to the cleaning apparatus 30 of the first preferred embodiment of the present invention is made possible by designing the pressing panel 11 to correspond to the shapes of the end portions as illustrated in FIGS. 4 and 5 according to the apparatus configuration described with reference to FIGS. 6 and 7.

Embodiment 2

Next, the arrangement of a cleaning apparatus 31 which is the second embodiment of the present invention will be described with reference to FIG. 8 illustrating an example of cleaning an insulating body 10 coated on the surface of a side wall 1 of the processing chamber 25. The present invention utilizes the processing chamber 25 of the plasma vacuum processing apparatus illustrated in FIG. 17 in an atmospheric state.

A pressing panel 11 having a pressing force controlling mechanism 8 is disposed on the upper portion of the conductive sheet 7. In order to closely adhere the adhesive surface 52 of the adhesive sheet to the insulating body 10 coated on the surface of the side wall 1 of the processing chamber 25, the pressing panel 11 should preferably have substantially the same curvature as the curvature of the inner side of the side wall 1 of the processing chamber 25 to be cleaned. A voltage applying mechanism 9 for applying positive or negative DC voltage is connected to the conductive sheet 7. The voltage applying mechanism 9 is arranged in the same manner as embodiment 1. The adhesive sheet 5 and the conductive sheet 7 are formed of equivalent materials as embodiment 1.

Next, a method for cleaning the insulating body 10 coated on the surface of the side wall 1 of the processing chamber 25 using the cleaning apparatus 31 according to the second embodiment of the invention will be described. First, an adhesive sheet 5 is adhered to the surface of an insulating body 10 coated on the surface of the side wall 1 of the processing chamber 25. The surface of the insulating body 10 coated on the surface of the side wall 1 of the processing chamber has a roughness in the order of a few µm to a few tens of µm, so that the thickness of the adhesive surface 52 should preferably be between 5 µm to 50 µm.

By bringing the adhesive surface 52 of the adhesive sheet 5 in contact with the insulating body 10 coated on the surface of the side wall 1 of the processing chamber 25 and pressing the pressing panel 11 from above the conductive sheet 7 onto the adhesive sheet 5 by the pressing force controlled via the pressing force controlling mechanism 8 disposed on the upper portion of the conductive sheet 7, the adhesive surface 52 of the adhesive sheet 5 can be closely adhered to the surface of the insulating body 10 coated on the surface of the side wall 1 of the processing chamber 25. In this state, positive or negative DC voltage is applied from the voltage applying mechanism 9 to the conductive sheet 7, to attract and attach to the adhesive surface 52 the particles 4 existing in the concaved portions at a depth of a few µm to a few tens of µm on the insulating body 10 coated on the surface of the side wall 1 of the processing chamber 25, to thereby clean the insulating body 10 coated on the surface of the side wall 1 of the processing chamber 25. The positive or negative voltage applied to the conductive sheet 7 can be temporally varied.

The concept of removing particles attached to the surface of the insulating body 10 coated on the surface of the side wall 1 of the processing chamber 25 using the cleaning apparatus 31 according to the second embodiment of the present invention is as described above with reference to FIGS. 2 and 3.

In order to clean the whole surface of the insulating body 10 coated on the surface of the side wall 1 of the processing chamber 25 by the cleaning apparatus 31 according to the second embodiment of the present invention, an adhesive sheet 5 is first adhered to the whole surface of the insulating body 10 coated on the surface of the side wall 1 of the processing chamber 25. In this state, through methods as described with reference to FIGS. 6 and 7, that is, by combining a plurality of cleaning apparatuses, or by forming the pressing panel 11 having the pressing force controlling mechanism 8 disposed above the conductive sheet 7 to have the same size (height and curvature) as that of the sidewall 1 of the processing chamber 25, it becomes possible to clean the whole surface of the insulating body 10 coated on the surface of the side wall 1 of the processing chamber 25.

Since the larger particles are first removed from the insulating body 10 coated on the surface of the side wall 1 of the processing chamber 25, the same portions should preferably be cleaned for a number of times in order to enhance the effect of cleaning. Further, it is preferable to replace the adhesive sheet 5 attached to the surface of the insulating body 10 coated on the surface of the side wall 1 of the processing chamber 25 every time the cleaning process is performed.

Embodiment 3

Next, the arrangement of a cleaning apparatus 32 according to a third embodiment of the present invention will be described with reference to FIG. 9 illustrating an example of cleaning an insulating body 10 coated on the surface of a side wall 1 of the processing chamber 25. The present invention utilizes the processing chamber 25 of the plasma vacuum processing apparatus illustrated in FIG. 17 in an atmospheric state.

An adhesive feeding roll 14 and an adhesive recovering roll 15 are arranged so as not to contact the side wall 1 of the processing chamber 25, so that an adhesive surface 52 of the adhesive sheet 5 is fed in an unused state and the adhesive surface 52 once attached to the insulating body 10 coated on the surface of the side wall 1 of the processing chamber 25 is not used again, and so that the used adhesive sheet 5 is recovered in a roll. The surface of the insulating body 10 coated on the surface of the side wall 1 of the processing chamber 25 has a roughness in the order of a few µm to a few tens of µm, so the thickness of the adhesive surface 52 should preferably be between 5 µm and 50 µm. The adhesive sheet 5 is formed of similar materials as those described in embodiment 1. At least the surface of an elastic structure 13 with a pressing force controlling mechanism 8 for controlling the pressing force has a conductive portion 17, and the elastic structure 13 is arranged between the adhesive feeding roll 14 and the adhesive recovering roll 15 and on the opposite side from the adhesive surface 52 of the adhesive sheet 5. For example, the conductive portion 17 is formed of similar materials as those described in embodiment 1. In order to closely adhere the adhesive surface 52 of the adhesive sheet 5 positioned below the structure 13 to the insulating body 10 coated on the surface of the side wall 1 of the processing chamber 25, the elasticity of the structure 13 should preferably be smaller than the intensity (hardness) of the insulating body 10 coated on the surface of the side wall 1 of the processing chamber 25.

A voltage applying mechanism 9 for applying positive or negative DC voltage to the conductive portion 17 is connected to the structure 13. The voltage applying mechanism 9 is arranged as described in embodiment 1.

Figure 10:
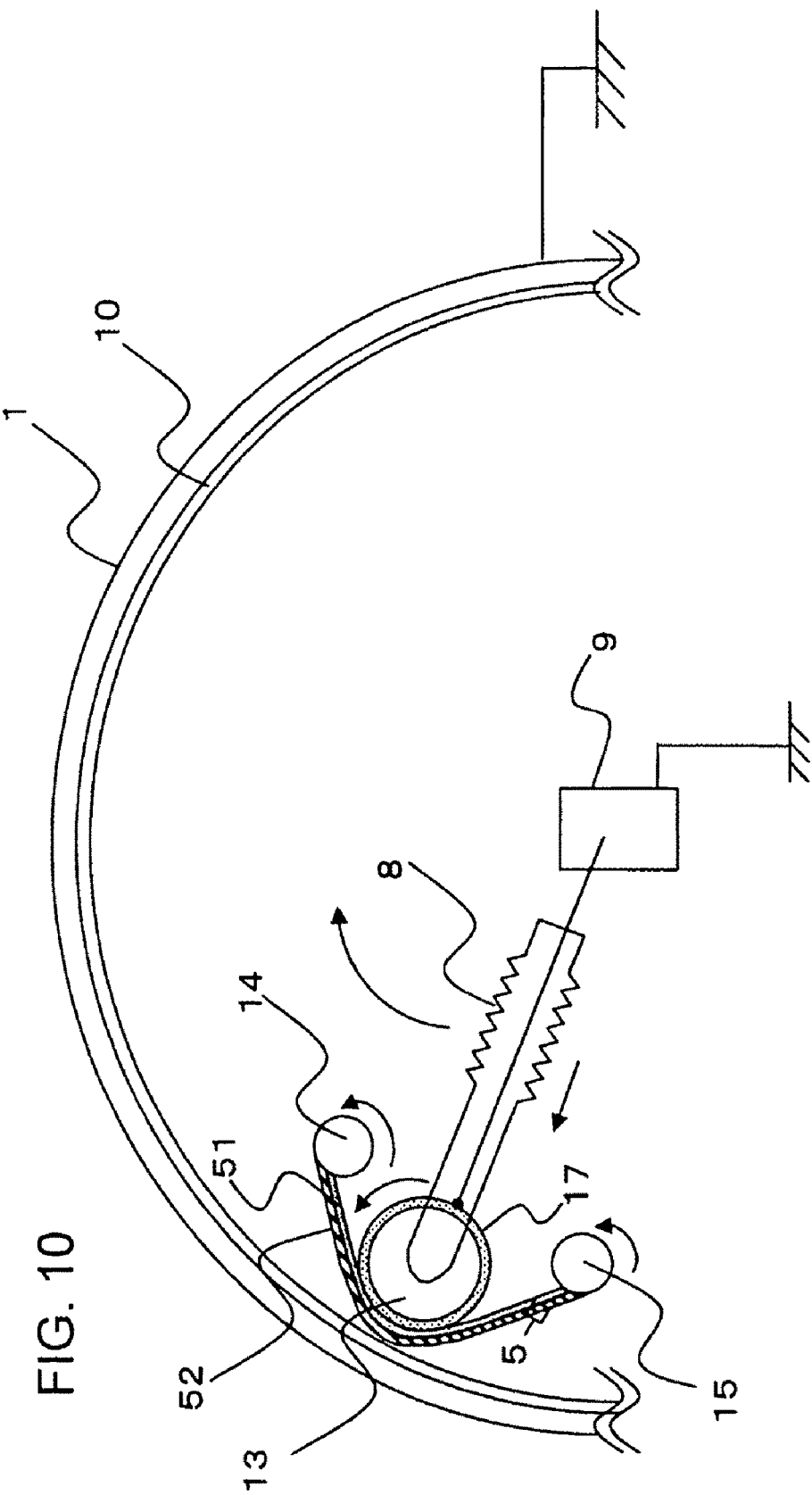
FIG. 10 is an explanatory view of the method for cleaning the whole surface of the side wall of the processing chamber according to the third embodiment of the present invention.

Now, the method for cleaning the whole surface of the insulating body 10 coated on the surface of the side wall 1 of the processing chamber 25 using the cleaning apparatus 32 according to the third embodiment of the present invention will be described with reference to FIG. 10.

The adhesive surface 52 of the adhesive sheet 5 is closely adhered to the surface of the insulating body 10 coated on the surface of the side wall 1 of the processing chamber 25 by pressing the structure 13 from above the adhesive sheet 5 with a pressing force controlled via the pressing force controlling mechanism 8. In this state, positive or negative DC voltage is applied to the conductive portion 17 from the voltage applying mechanism 9. Thereby, the portion where the adhesive surface 52 of the adhesive sheet 5 is closely adhered to the surface of the insulating body 10 coated on the surface of the side wall 1 of the processing chamber 25 is cleaned. The cleaning apparatus 32 and the structure 13 are moved along the curved surface of the side wall 1 of the processing chamber 25 while rotating the structure 13, while applying positive or negative DC voltage to the conductive portion 17 from the voltage applying mechanism 9 and maintaining a constant pressing force controlled via the pressing force controlling mechanism 8. At the same time, adhesive sheet 5 is fed from the adhesive feeding roll 14, and the adhesive sheet 5 having been attached to the surface of the insulating body 10 coated on the surface of the side wall 1 of the processing chamber 25 is recovered into the adhesive recovering roll 15, so as to prevent recontamination, that is, to prevent particles attached to the adhesive surface 52 of the adhesive sheet 5 from being attached again to the insulating body 10 coated on the surface of the side wall 1 of the processing chamber 25 at the new area to be cleaned. Thereby, the whole surface of the insulating body 10 having been coated on the surface of the side wall 1 of the processing chamber 25 can be cleaned. The positive or negative voltage applied by the voltage applying mechanism 9 can be changed temporally.

Since the larger particles are removed first from the insulating body 10 coated on the surface of the side wall 1 of the processing chamber 25, the same portions should preferably be cleaned for a number of times in order to enhance the effect of cleaning.

The concept of removing particles existing on the surface of the insulating body 10 coated on the surface of the side wall 1 of the processing chamber 25 using the cleaning apparatus 32 according to the third embodiment of the present invention is described with reference to FIGS. 2 and 3.

Embodiment 4

Figure 11:
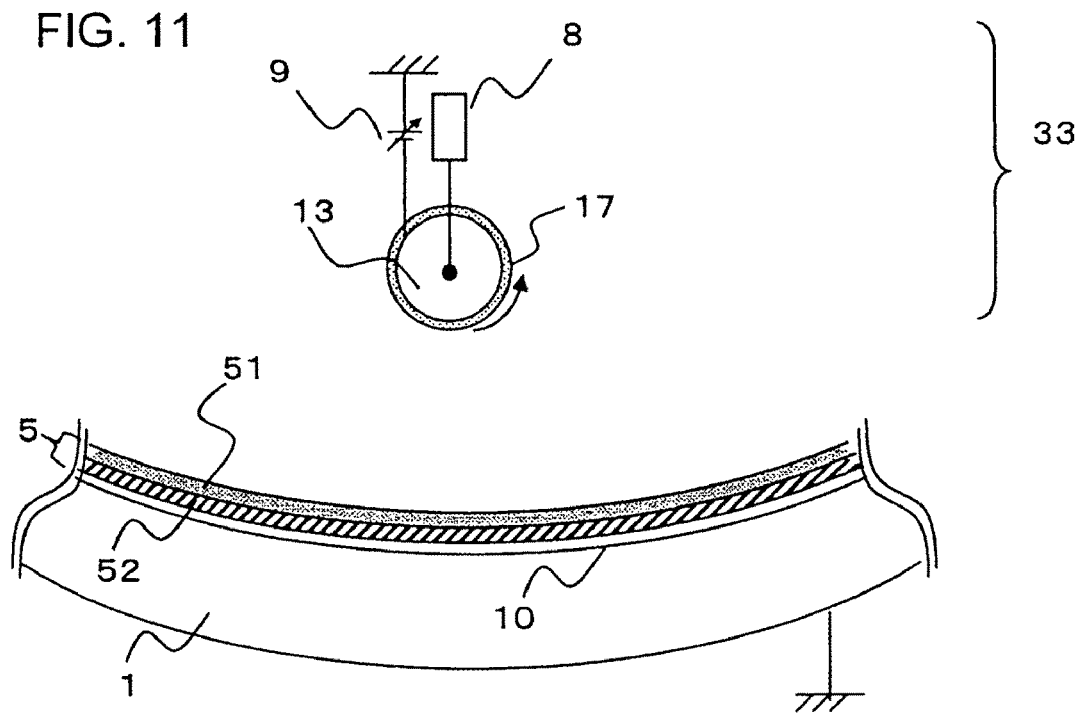
FIG. 11 is a schematic view illustrating the arrangement of a cleaning apparatus according to a fourth embodiment of the present invention.

Next, the arrangement of a cleaning apparatus 33 which is the fourth embodiment of the present invention will be described with reference to FIG. 11 illustrating an example of cleaning an insulating body 10 coated on the surface of a side wall 1 of the processing chamber 25. The present invention utilizes the processing chamber 25 of the plasma vacuum processing apparatus illustrated in FIG. 17 in an atmospheric state.

At least the surface of an elastic structure 13 having a pressing force controlling mechanism 8 for controlling the pressing force has a conductive portion 17. For example, the conductive portion 17 is formed of similar materials as those described in embodiment 1. A voltage applying mechanism 9 for applying positive or negative DC voltage to the conductive portion 17 is connected to the structure 13. The voltage applying mechanism 9 has the same arrangement as described in embodiment 1. The elasticity of the structure 13 should preferably be smaller than the intensity (hardness) of the insulating body 10 coated on the surface of the side wall 1 of the processing chamber 25.

Figure 12:
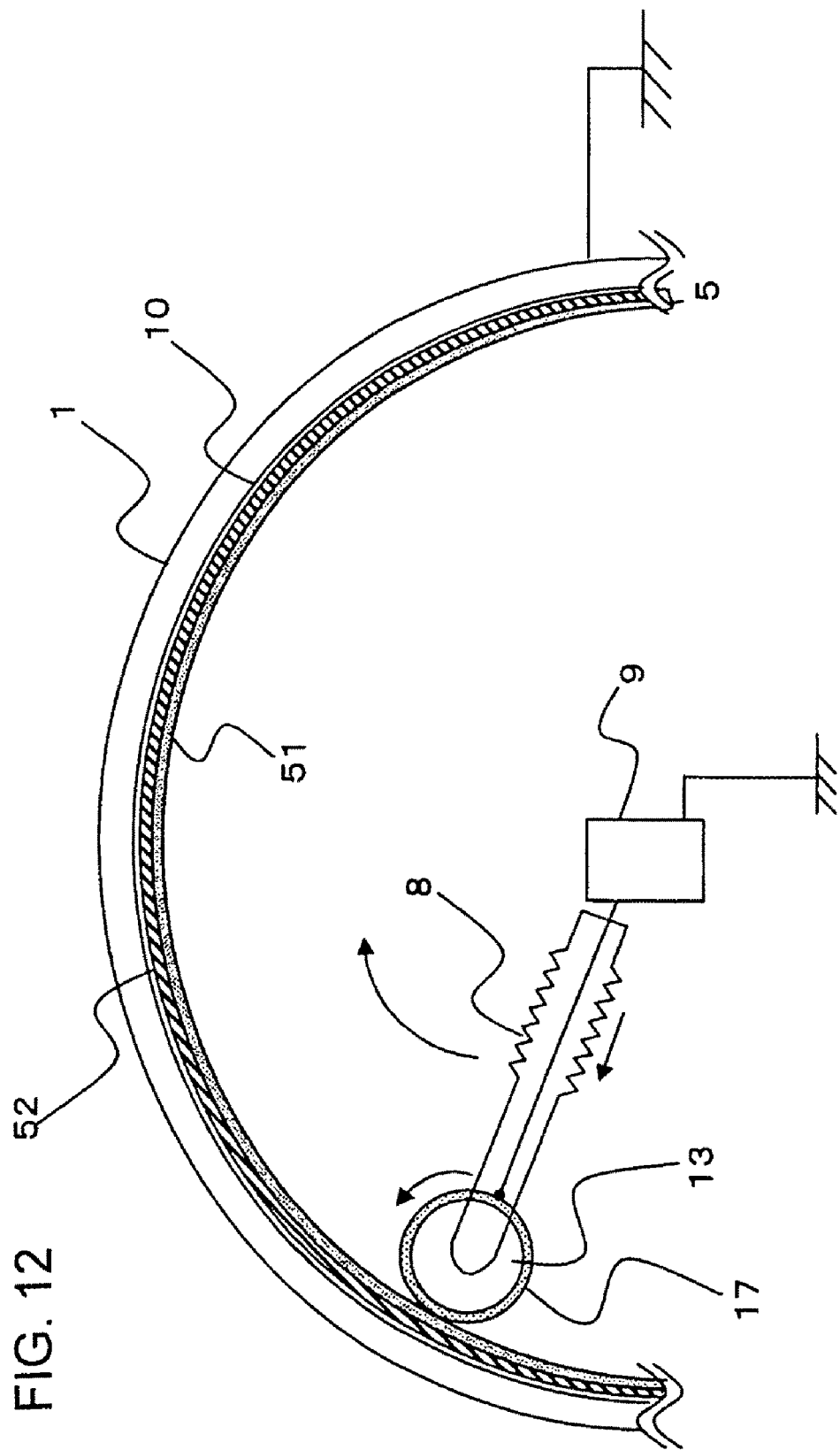
FIG. 12 is an explanatory view of the method for cleaning the whole surface of the side wall of the processing chamber according to the fourth embodiment of the present invention.

Now, the method for cleaning the whole surface of the insulating body 10 coated on the surface of the side wall 1 of the processing chamber 25 using the cleaning apparatus 33 according to the fourth embodiment of the present invention will be described with reference to FIG. 12.

First, an adhesive sheet 5 is attached to the surface of the insulating body 10 coated on the surface of the side wall 1 of the processing chamber 25. The surface of the insulating body 10 coated on the surface of the side wall 1 of the processing chamber 25 has a roughness in the order of a few μm to a few tens of μm, so the thickness of the adhesive surface 52 should preferably be between 5 μm to 50 μm. The adhesive sheet 5 is formed of similar materials as those described in embodiment 1.

The adhesive surface 52 of the adhesive sheet 5 is closely adhered to the surface of the insulating body 10 coated on the surface of the side wall 1 of the processing chamber 25 by pressing the structure 13 from above the adhesive sheet 5 with a pressing force controlled via the pressing force controlling mechanism 8. In this state, positive or negative DC voltage is applied to the conductive portion 17 from the voltage applying mechanism 9. Thereby, the portion where the adhesive surface 52 of the adhesive sheet 5 is closely adhered to the surface of the insulating body 10 coated on the surface of the side wall 1 of the processing chamber 25 is cleaned. The cleaning apparatus 33 and the structure 13 are moved along the curved surface of the side wall 1 of the processing chamber 25 by rotating the structure 13, while applying positive or negative DC voltage to the conductive portion 17 from the voltage applying mechanism 9 and maintaining a constant pressing force controlled via the pressing force controlling mechanism 8. Thereby, the whole surface of the insulating body 10 coated on the surface of the side wall 1 of the processing chamber 25 can be cleaned. The positive or negative voltage applied by the voltage applying mechanism 9 can be changed temporally.

Since the larger particles are removed first from the insulating body 10 coated on the surface of the side wall 1 of the processing chamber 25, the same portions should preferably be cleaned for a number of times in order to enhance the effect of cleaning. Further, the adhesive sheet 5 attached to the surface of the insulating body 10 coated on the surface of the side wall 1 of the processing chamber 25 should be exchanged each time the cleaning is performed. This enables to prevent recontamination, that is, to prevent particles attached to the adhesive surface 52 from being reattached to the insulating body 10 coated on the surface of the side wall 1 of the processing chamber 25 at the new portion to be cleaned.

The concept of removing particles existing on the surface of the insulating body 10 coated on the surface of the side wall 1 of the processing chamber 25 using the cleaning apparatus 33 according to the fourth embodiment of the present invention is described with reference to FIGS. 2 and 3.

Embodiment 5

Figure 16:
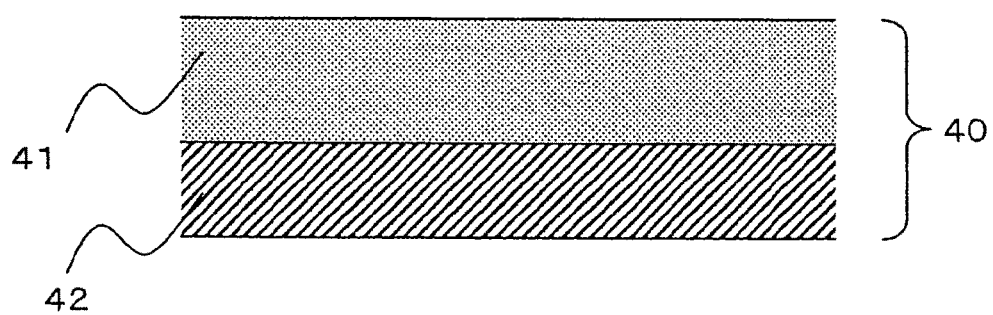
FIG. 16 is a schematic view illustrating the arrangement of a conductive tape according to the second embodiment of the present invention.
Figure 17:
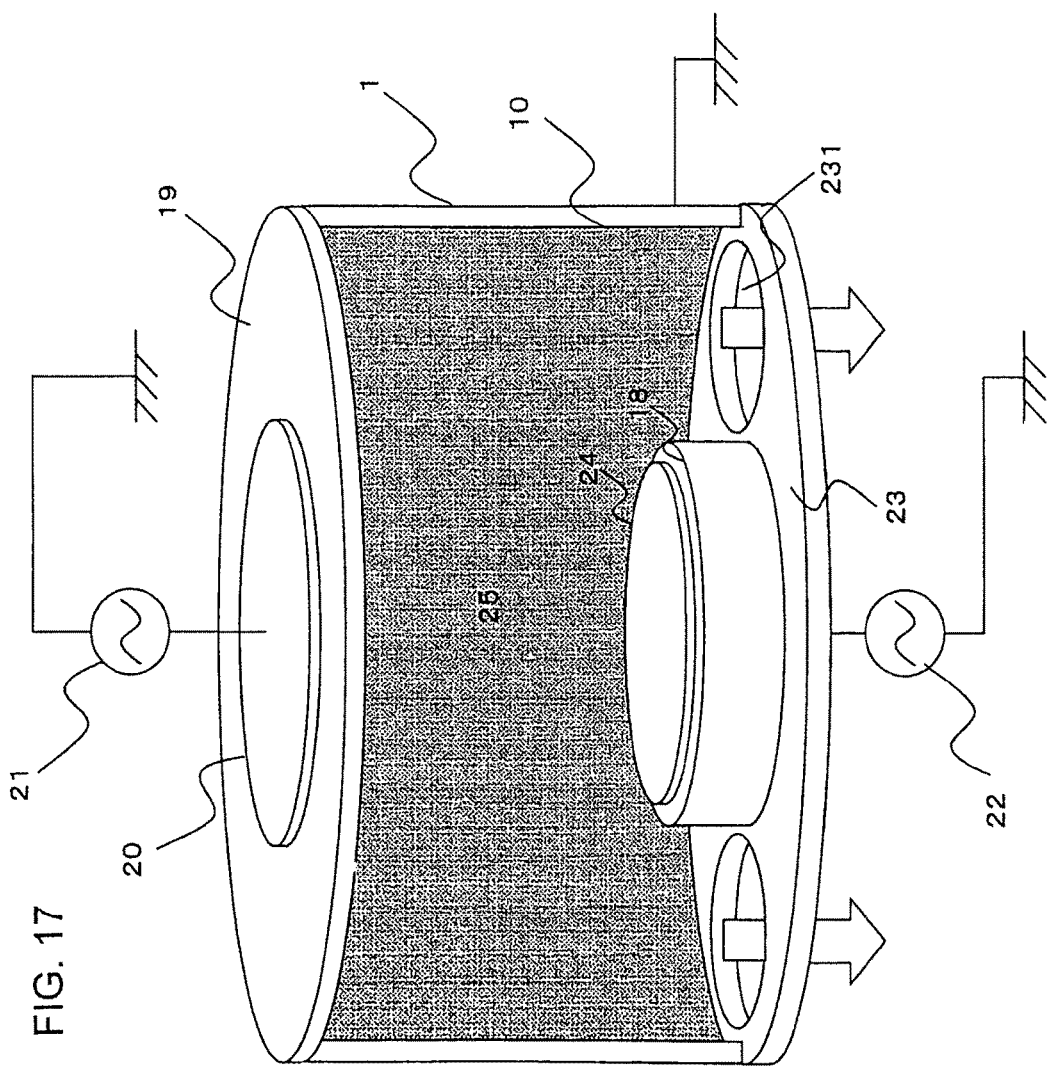
FIG. 17 is a schematic view illustrating the arrangement of a plasma vacuum processing apparatus.

FIG. 16 illustrates the structure of a conductive tape 40, which is the fifth embodiment of the present invention. The conductive tape 40 has an adhesive layer 42 attached to a conductive sheet 41. The surface of the insulating body 10 coated on the surface of the side wall 1 of the processing chamber 25 has a roughness in the order of a few μm to a few tens of μm, so the thickness of the adhesive layer 42 should preferably be between 5 μm to 50 μm. Further, the adhesive layer 42 should preferably have conductivity.

Next, the method for cleaning the insulating body 10 coated on the surface of the side wall 1 of the processing chamber 25 using a conductive tape 40 according to the fifth embodiment of the present invention will be described. The present invention utilizes the processing chamber 25 of the plasma vacuum processing apparatus illustrated in FIG. 17 in an atmospheric state. A conductive tape 40 is adhered to the surface of the insulating body 10 coated on the surface of the side wall 1 of the processing chamber 25. The conductive tape 40 includes an adhesive layer 42 attached to a conductive sheet 41, so that by applying positive or negative voltage to the conductive sheet 41, the insulating body 10 coated on the surface of the side wall 1 of the processing chamber 25 can be cleaned. The positive or negative voltage applied to the conductive sheet 7 can be varied temporally.

Figure 13:
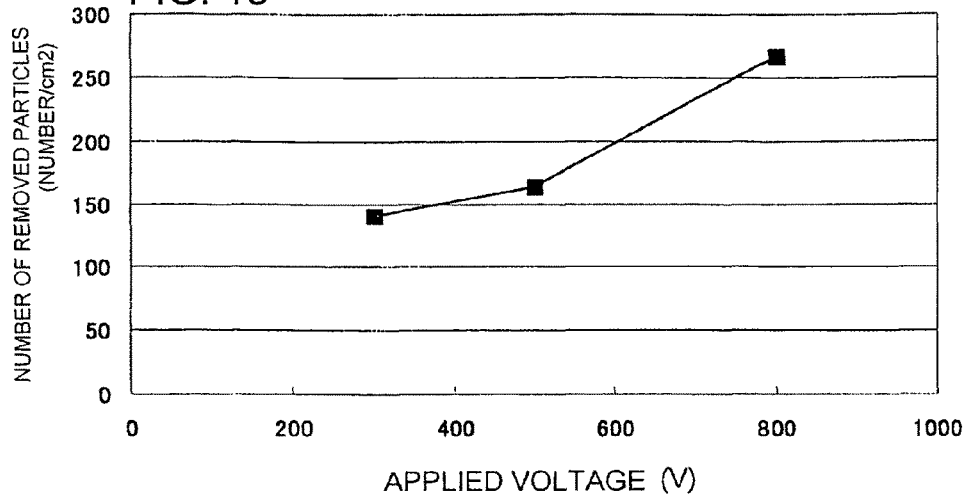
FIG. 13 is an explanatory view showing the relationship between the number of particles and applied voltage according to the first to fourth embodiments of the present invention.
Figure 14:
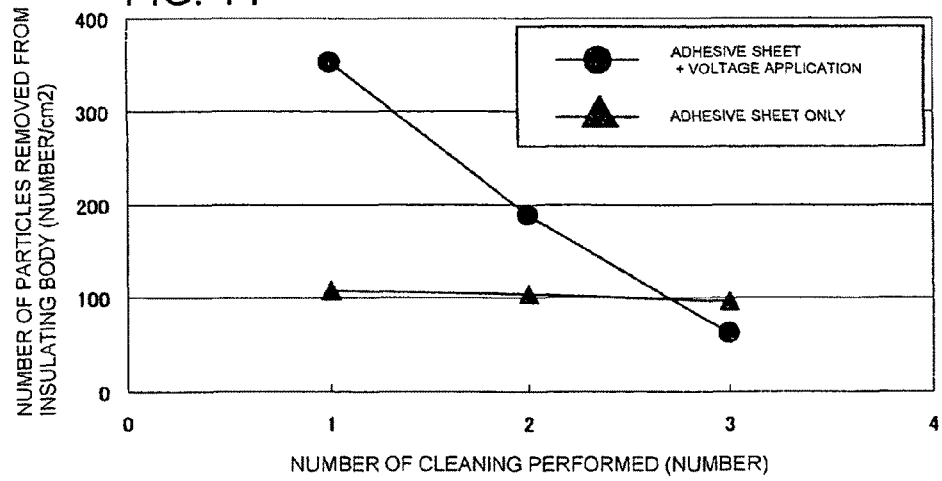
FIG. 14 is an explanatory view showing the relationship between application of voltage and the number of particles according to first to the fourth embodiments of the present invention.
Figure 15:
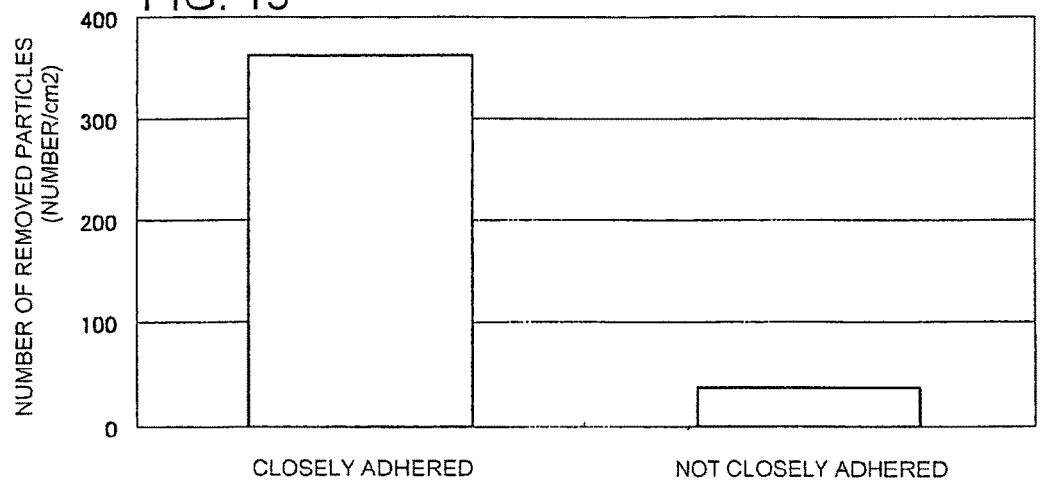
FIG. 15 is an explanatory view showing the relationship between the number of particles and the degree of adhesion of the adhesive sheet according to the first to fourth embodiments of the present invention.

FIGS. 13 through 15 illustrate the effect of the cleaning performed according to the preferred embodiments of the present invention. FIG. 13 shows the number of particles stuck to the insulating body 10 coated on the surface of the side wall 1 of the processing chamber 25 being removed when the voltage applied to the conductive sheet 7 or the conductive portion 17 is changed. It can be recognized from the drawing that when the applied voltage is increased, the electrostatic attraction force generated at the adhesive surface 52 of the adhesive sheet 5 is increased, so the effect of removing particles stuck to the insulating body 10 coated on the surface of the side wall 1 of the processing chamber 25 is increased.

FIG. 14 illustrates the relationship between the number of cleaning performed and the number of particles attached to the insulating body 10 coated on the surface of the side wall 1 of the processing chamber 25, comparing a case where voltage is applied to the conductive sheet 7 or the conductive portion 17 and electrostatic attraction force is generated in the adhesive surface 52 of the adhesive sheet 5 and a case where only the adhesive sheet is used. It can be recognized from the drawing that in the first and second cleaning, a greater number of particles are removed from the insulating body when voltage is applied to the conductive sheet 7 or the conductive portion 17 and electrostatic attraction force is generated to the adhesive surface 52 of the adhesive sheet 5. This is because the particles attached to the concaved portions of the insulating body 10 coated on the surface of the side wall 1 of the processing chamber 25 are attracted to the adhesive surface 52 by the application of voltage. Thus, a large number of particles can be removed by generating electrostatic attraction force to the adhesive surface 52 of the adhesive sheet 5 by applying voltage to the conductive sheet 7 or the conductive portion 17, and by increasing the performed number of cleaning. On the other hand, if only the adhesive sheet 5 is used, the particles attached to the concaved portions of the insulating body 10 coated on the surface of the side wall 1 of the processing chamber 25 cannot be removed, so that only a small number of particles are removed, and it becomes necessary to increase the number of cleaning to be performed.

FIG. 15 illustrates a comparison between the number of particles removed from the insulating body 10 coated on the surface of the side wall 1 of the processing chamber 25 when the adhesive surface 52 of the adhesive sheet 5 is closely adhered to the surface of the insulating body 10 coated on the surface of the side wall 1 of the processing chamber 25 and applying voltage to the conductive sheet 7 or the conductive portion 17 to generate electrostatic attraction force to the adhesive surface 52 of the adhesive sheet 5 and the number of removed particles when the adhesive sheet 5 had not been closely adhered and voltage is applied to the conductive sheet 7 or the conductive portion 17 to generate electrostatic attraction force to the adhesive surface 52 of the adhesive sheet 5. It can be recognized from this drawing that according to the system in which the adhesive sheet and the application of voltage are used in combination, the effect of removing particles is not high if the adhesive surface 52 of the adhesive sheet 5 is not closely adhered.

Therefore, according to the present invention, by closely adhering the adhesive surface 52 of the adhesive sheet 5 to the insulating body 10 and applying voltage to the conductive sheet 7 or the conductive portion 17 to thereby generate electrostatic attraction force, it becomes possible to remove particles attached to concaved and convexed portions of the insulating body 10 coated on the surface of the side wall of the processing chamber 25.

As described, the present invention provides an effective cleaning apparatus and cleaning method for removing particles attached to metal components having the surface thereof coated with an insulating body, especially in plasma processing apparatuses used for manufacturing semiconductors or in testing apparatuses.

According to the cleaning apparatus of the present invention, the particles attached to curved surfaces to be cleaned in vacuum processing apparatuses or particles attached to fine uneven concaved and convexed portions on the surface of the insulating body coated on the surface of metal components can be removed, so that even when plasma processing is started, particles will not be attached to the surface of the samples to be processed, and the amount of contamination of the chamber will not be increased, according to which defective semiconductor devices are reduced and failure is prevented.

What is claimed is:

1. A cleaning apparatus comprising:
   an adhesive sheet including a base material and an adhesive surface for removing particles, the adhesive surface being configured to adhere to a portion to be cleaned of a vacuum processing apparatus;
   a conductive sheet in contact with the base material;
   a pressing member configured to press the conductive sheet;
   a voltage applying mechanism configured to apply positive or negative voltage to the conductive sheet; and
   a pressing force controlling mechanism configured to control a force that adheres the adhesive sheet to a portion to be cleaned of a vacuum processing apparatus via the pressing member;
   wherein the pressing member has a shape similar to a surface shape of the portion to be cleaned of the vacuum processing apparatus; and
   wherein the adhesive surface generates an electrostatic attraction by positive or negative voltage applied to the conductive sheet by the voltage applying mechanism.

2. The cleaning apparatus according to claim 1,
   wherein the adhesive sheet, the conductive sheet and the pressing member are integrally formed; and
   wherein the adhesive surface of the integrally formed adhesive sheet, the conductive sheet and the pressing member have a curved surface with a same curvature as the curvature of the curved surface of the portion to be cleaned of the vacuum processing apparatus.

3. The cleaning apparatus according to claim 1, further comprising:
   a recovering mechanism for recovering the adhesive sheet onto a roll; wherein the adhesive sheet includes a roll shape; and the pressing member includes a pressing member of a roller shape including a elastic material in which the conductive sheet is arranged on the surface thereof.

4. The cleaning apparatus according to claim 1, wherein the pressing member includes a roller-like pressing member including an elastic material having the conductive sheet arranged on the surface thereof.

5. A cleaning apparatus comprising:
a conductive sheet in contact with an adhesive sheet the adhesive sheet being configured to adhere to a portion to be cleaned of a vacuum processing apparatus;
a pressing member configured to press the conductive sheet;
a pressing force controlling mechanism configured to control a force for adhering the adhesive sheet to a portion to be cleaned of the vacuum processing apparatus via the pressing member; and
a voltage applying mechanism configured to apply positive or negative voltage to the conductive sheet;
wherein the pressing member has a shape similar to a surface shape of the portion to be cleaned of the vacuum processing apparatus; and
wherein the adhesive surface generates an electrostatic attraction by positive or negative voltage applied to the conductive sheet by the voltage applying mechanism.

6. A cleaning apparatus comprising:
an adhesive sheet including a base material and an adhesive surface for removing particles, the adhesive surface being configured to adhere to a portion to be cleaned of a vacuum processing apparatus;
a conductive sheet in contact with the base material;
a pressing member means for pressing the conductive sheet;
a voltage applying mechanism means for applying positive or negative voltage to the conductive sheet; and
a pressing force controlling mechanism means for controlling a force that adheres the adhesive sheet to a portion to be cleaned of a vacuum processing apparatus via the pressing member;
wherein the pressing member means has a shape similar to a surface shape of the portion to be cleaned of the vacuum processing apparatus; and
wherein the adhesive surface generates an electrostatic attraction by positive or negative voltage applied to the conductive sheet by the voltage applying mechanism means.

7. The cleaning apparatus according to claim 6,
wherein the adhesive sheet, the conductive sheet and the pressing member means are integrally formed; and
wherein the adhesive surface of the integrally formed adhesive sheet, the conductive sheet and the pressing member means have a curved surface with a same curvature as the curvature of the curved surface of the portion to be cleaned of the vacuum processing apparatus.

8. The cleaning apparatus according to claim 6, further comprising:
a recovering mechanism means for recovering the adhesive sheet into a roll;
wherein the adhesive sheet includes a roll shape; and
wherein the pressing member means includes a pressing member of a roller shape including a elastic material in which the conductive sheet is arranged on the surface thereof.

9. The cleaning apparatus according to claim 6, wherein the pressing member means includes a roller-like pressing member including an elastic material having the conductive sheet arranged on the surface thereof.

* * * * *